(12) United States Patent
Shiomi et al.

(10) Patent No.: US 7,754,973 B2
(45) Date of Patent: Jul. 13, 2010

(54) ELECTRODE WIRE FOR SOLAR CELL

(75) Inventors: Kazuhiro Shiomi, Osaka (JP); Masaaki Ishio, Osaka (JP); Toshiaki Fujita, Hirakata (JP)

(73) Assignee: Neomax Materials Co., Ltd., Osaka (JP)

( * ) Notice: Subject to any disclaimer, the term of this patent is extended or adjusted under 35 U.S.C. 154(b) by 408 days.

(21) Appl. No.: 11/569,450

(22) PCT Filed: May 18, 2005

(86) PCT No.: PCT/JP2005/009027

§ 371 (c)(1), (2), (4) Date: Feb. 20, 2008

(87) PCT Pub. No.: WO2005/114751

PCT Pub. Date: Dec. 1, 2005

(65) Prior Publication Data

US 2008/0169020 A1 Jul. 17, 2008

(30) Foreign Application Priority Data

May 21, 2004 (JP) .............................. 2004-152538

(51) Int. Cl.
*H01B 5/00* (2006.01)
(52) U.S. Cl. .................................................. 174/126.2
(58) Field of Classification Search ............... 174/94 R, 174/126.2
See application file for complete search history.

(56) References Cited

U.S. PATENT DOCUMENTS

| | | | | |
|---|---|---|---|---|
| 2,414,463 A | * | 1/1947 | Gunn et al. ................ | 200/268 |
| 4,521,801 A | * | 6/1985 | Kato et al. ................ | 257/748 |
| 2002/0112344 A1 | * | 8/2002 | Harada et al. ............... | 29/605 |
| 2003/0024733 A1 | | 2/2003 | Aoyama et al. | |
| 2004/0207071 A1 | | 10/2004 | Shiomi et al. | |
| 2005/0039943 A1 | | 2/2005 | Endo et al. | |
| 2007/0017570 A1 | | 1/2007 | Endo et al. | |

FOREIGN PATENT DOCUMENTS

| | | |
|---|---|---|
| EP | 1 758 175 A1 | 2/2007 |
| JP | 59-204547 | 11/1984 |
| JP | 59-204548 | 11/1984 |

(Continued)

OTHER PUBLICATIONS

International Search Report for PCT Application No. PCT/JP2005/009027; mailed Aug. 30, 2005.

(Continued)

*Primary Examiner*—Chau N Nguyen
(74) *Attorney, Agent, or Firm*—Keating & Bennett, LLP

(57) ABSTRACT

A solar cell electrode wire includes a core material having a volume resistivity of not greater than about 2.3 μΩ·cm and a proof strength in the range of about 19.6 MPa to about 85 MPa, and a hot-dip solder plating layer disposed on a surface of the core material. The core material is preferably an annealed pure copper material having an oxygen content of not higher than about 20 ppm. The core material may be a clad material including an interlayer of aluminum and copper layers disposed on opposite surfaces of the interlayer.

12 Claims, 2 Drawing Sheets

FOREIGN PATENT DOCUMENTS

| | | |
|---|---|---|
| JP | 60-015937 | 1/1985 |
| JP | 09-064258 A | 3/1997 |
| JP | 10-335767 * | 12/1998 |
| JP | 11-021660 | 1/1999 |
| JP | 2001-352014 A | 12/2001 |
| JP | 2002-263880 | 9/2002 |
| JP | 2002-353475 A | 12/2002 |
| JP | 2003-209197 A | 7/2003 |
| JP | 2004-152538 | 5/2004 |
| JP | 2004-204256 | 7/2004 |
| JP | 2004-204257 | 7/2004 |
| JP | 2005-050780 | 2/2005 |
| JP | 2006-054355 A | 2/2006 |
| WO | 2005/114751 A1 | 12/2005 |

OTHER PUBLICATIONS

JIS Mechanical Engineering Handbook, edited by JIS Mechanical Engineering Handbook Editing Committee and Shimizu, Chizuko, issued by Mechanical Institute, LTD, Apr. 1, 1974, vol. 14, pp. 4.1-4.2, 7.6-7.7.

Deliberation by Japanese Industrial Standards Commitee, "Method of Tensile Test[ing] for Metallic Materials," edited by Itakura, Shogo, JIS, Z 2241, first printed Dec. 20, 1998, revised Feb. 28, 1999, pp. 1, 5.6.

Deliberation by Japanese Industrial Standards Committee, "Glossary of Terms Used in Iron and Steel (Testing)," edited by Itakura, Shogo, JIS, G 0202, first printed Apr. 30, 1987, established on Mar. 1, 1987, pp. 5-6.

Ichikawa, Takaaki, et al., "Development of Copper Bonding Wire," Special Section for Optoelectronics, issued by Hitachi Cable LTD., Jan. 1991, No. 10, pp. 53-56.

Okamoto, Harumichi, et al., "Development of High Purity Copper and the Characteristics," J. Mining and Materials, Special edition for material field, Feb. 1989, vol. 105, No. 2, pp. 150-153.

Aoyama, Seigi, et al., "Effects of Hot-Working Processes and Impurities on the Properties of Cold-Drawn Cu Wires," J. Japan Inst. Metals, Sep. 1987, vol. 51, No. 9, pp. 858-863.

Aoyama, Seigi, et al., "Stiffness of Annealed Copper Wires," J. Japan Inst. Metals, May 1988, vol. 52, No. 5, pp. 477-484.

"Data Book of Copper Extrusion Products," edited by Japan Copper Extrusion Products Data Book Editing Committee, issued by Japan Copper Extrusion Institute, Apr. 1, 1997, pp. 88-89, 96, and its partial translation.

Teshigawara et al., "Establishment of Manufacturing Technology for Oxygen-Free Copper for Electronic Devices Using Shaft Furnace," Furukawa Electric Current Reports, issued by Furukawa Electric Co., Ltd., Jan. 2004, vol. 113, pp. 49-53, in particular and its partial translation.

Sugiyama, "Nonferrous Metals Materials," Standard Metal Engineering Course 4, issued by Corona Publishing Co., Ltd. Mar. 30, 1978, pp. 12-13, and its partial translation.

"JIS H 2123 Copper billets and cakes," JIS Handbook 2 Nonferrous Metals, edited and issued by Japanese Standards Association, 2000, pp. 241-243, and its partial translation.

* cited by examiner

US 7,754,973 B2

ELECTRODE WIRE FOR SOLAR CELL

BACKGROUND OF THE INVENTION

1. Field of the Invention

The present invention relates to an electrode wire used as a connection lead wire for a solar cell.

2. Description of the Related Art

A solar cell includes a semiconductor substrate of a silicon semiconductor having PN junctions, and a connection lead wire soldered to a solder band provided across a plurality of linear front surface electrodes disposed on a front surface of the semiconductor substrate. A plurality of such solar cells are generally connected in series to provide a desired electromotive force. For the serial connection, one surface (a lower surface) of a connection lead wire is soldered to a front surface electrode of one solar cell, and the other surface (an upper surface) of the connection lead wire is soldered to a relatively large rear surface electrode of an adjacent solar cell.

An electrode wire that is conventionally used as a material for the connection lead wire includes a core material of a flattened copper wire prepared by rolling a tough pitch copper wire having a round cross section, and hot-dip solder plating layers formed on surfaces of the core material. The formation of the hot-dip solder plating layers is achieved by using a hot-dip plating method for plating the flattened copper wire. That is, the surfaces of the flattened copper wire are cleaned with an acid or other suitable cleaner, and the flattened copper wire is dipped in a molten solder bath, whereby the solder plating layers are formed on the surfaces of the core material of the flattened copper wire. The hot-dip solder plating layers each have a mound shape that bulges from lateral edges to a middle portion of the core material by surface tension occurring when the molten solder adhering to the core material is solidified.

When the electrode wire is soldered to the semiconductor substrate, the heating temperature is strictly controlled at a lower temperature around the melting point of the solder. This is because there is a difference in thermal expansion coefficient between copper for the core material of the electrode wire and silicon as an exemplary material for the semiconductor substrate. That is, the electrode wire is soldered at a lower temperature in order to minimize thermal stress which may otherwise cause cracks in the expensive semiconductor substrate.

In a conventional case, the semiconductor substrate has a thickness of about 300 μm. However, in recent years, the semiconductor substrate tends to have a reduced thickness for cost reduction. A semiconductor substrate recently used has a thickness of about 250 μm. Therefore, the electrode wire using the conventional flattened wire as the core material is likely to cause cracks in the semiconductor substrate during the soldering. To prevent the cracking, an electrically conductive material having a smaller difference in thermal expansion from the semiconductor substrate material has recently been used for the core material. In JP-A-60-15937 (Patent Document 1), for example, a clad material is disclosed as the electrically conductive material, which includes an interlayer of Invar or an alloy of Fe and Ni (having a typical composition of Fe-36% Ni) and copper layers disposed on opposite surfaces of the interlayer. Besides Invar, Kovar (registered trade mark) or an Fe—Ni—Co alloy is used as the lower thermal expansion alloy.

In JP-A-59-204547 (Patent Document 2) and JP-A-59-204548 (Patent Document 3), aluminum-copper based clad materials each including a chromium layer or a zinc layer formed in a bonding interface between an aluminum or aluminum alloy material and a copper or copper alloy material are proposed as a lead frame material for a semiconductor device, although they are used in a field different from the field of the solar cells.

The electrode wire (which is sometimes referred to as "clad electrode wire") including the clad material as the core material as disclosed in Patent Document 1 alleviates the thermal stress occurring in the semiconductor substrate, but has an increased average electric resistance, which reduces the power generation efficiency of the solar cell, because the interlayer is made of an alloy material such as the Fe—Ni alloy or the Fe—Ni—Co alloy which has a relatively high volume resistivity.

The aluminum-copper based clad materials of Patent Documents 2 and 3 are used in a different field from the field of the solar cell electrode wire. In addition, aluminum is exposed on one surface of such a clad material, making it impossible to form the hot-dip solder plating layer on the surface.

SUMMARY OF THE INVENTION

To overcome the problems described above, preferred embodiments of the present invention provide an electrode wire for a solar cell, which is usable as an alternative to the conventional clad electrode wire, which is less likely to cause cracks in a solar cell semiconductor substrate during soldering, and which has excellent electrical conductivity.

An electrode wire for a solar cell according to a preferred embodiment of the present invention includes a core material having a volume resistivity of not greater than about 2.3 μΩ·cm and a proof strength in the range of about 19.6 MPa to about 85 MPa, and a hot-dip solder plating layer disposed on a surface of the core material.

In the solar cell electrode wire, the proof strength of the core material is preferably in the range of about 19.6 MPa to about 85 MPa. Therefore, the electrode wire can be easily handled in a hot-dip solder plating process and subsequent processes without excessive deformation thereof. In addition, when the electrode wire is soldered to the semiconductor substrate, thermal stress occurring in the semiconductor substrate during solidification is alleviated by plastic self-deformation of the electrode wire arising from the thermal stress. Therefore, cracking is unlikely to occur in the semiconductor substrate. Since the volume resistivity is not greater than about 2.3 μΩ·cm, the electrode wire has excellent electrical conductivity and power generation efficiency.

In the electrode wire, the core material is preferably composed of an annealed pure copper material having an oxygen content of not greater than about 20 ppm. With the use of the annealed material, the production costs are significantly reduced as compared to the conventional clad electrode wire. In contrast to the clad electrode wire using the clad material as the core material, the electrode wire using a single layer material as the core material is sometimes referred to as "single layer electrode wire".

Instead of the single layer core material, a clad core material may be used which includes an interlayer, and first and second surface layers disposed on opposite surfaces of the interlayer. By using proper materials for the clad core material, the average volume resistivity and the average proof strength are easily set within the aforementioned ranges, whereby various types of clad electrode wires can be provided. In this case, where the first and second surface layers are made of the same material and have the same thickness, the electrode wire is prevented from being thermally deformed during soldering, thereby improving the efficiency of the soldering operation.

The first surface layer and the second surface layer are preferably composed of pure Cu or a Cu alloy primarily including Cu and the interlayer is preferably composed of pure Al or an Al alloy primarily including Al. These materials are readily available at lower costs, making it possible to provide the inventive clad electrode wire at lower costs. Where these materials are used in combination, the interlayer preferably has a thickness which is preferably in the range of about 10% to about 50% of the entire thickness of the clad material. If the percentage of the thickness is less than about 10%, it is difficult to achieve the proof strength in the aforementioned range. If the percentage of the thickness is greater than about 50%, it is difficult to achieve the volume resistivity in the aforementioned range.

In the single layer electrode wire and the clad electrode wire according to preferred embodiments of the present invention, each of the core materials preferably includes a recessed portion arranged along a longitudinal direction of the core material for storing molten solder and the hot-dip solder plating layer located in the recessed portion. With the hot-dip solder storing recessed portion, the middle portion of the molten solder supplied in the recessed portion is less likely to bulge when being solidified, so that the hot-dip solder plating layer is flattened. This improves the solderability of the electrode wire to ensure excellent bondability.

An opening width of the hot-dip solder storing recessed portion as measured transversely to the core material is preferably not less than about 90% of the width of the core material. With the opening width of the recessed portion being not less than about 90% of the width of the core material, the molten solder supplied in the hot-dip solder storing recessed portion is easily flattened across the width of the core material when being solidified. This improves the solderability.

A solar cell including the electrode wire described above includes a semiconductor substrate including a semiconductor having PN junctions and a connection lead wire soldered to a plurality of front surface electrodes disposed on a front surface of the semiconductor substrate, wherein the connection lead wire is the single layer electrode wire or the clad electrode wire described above. When the electrode wire having the hot-dip solder storing recessed portion is used as the connection lead wire, the connection lead wire is soldered with the hot-dip solder plating layer filled in the recessed portion. In the solar cell, the solar cell semiconductor substrate is less likely to be cracked, because the connection lead wire has the features, actions and effects provided by the electrode wire according to preferred embodiments of the present invention. Furthermore, the solar cell has excellent electrical conductivity and power generation efficiency.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Electrode wires according to preferred embodiments of the present invention will hereinafter be described with reference to the drawings.

Figure 1:
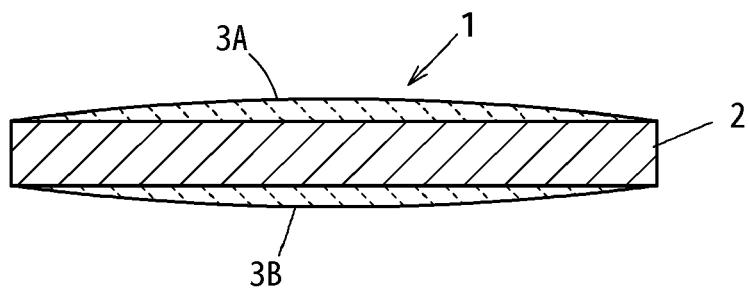
FIG. 1 is a cross sectional view of a single layer electrode wire according to a first preferred embodiment of the present invention.

FIG. 1 is a single layer electrode wire 1 according to a first preferred embodiment of the present invention. The electrode wire 1 includes a core material 2 having an elongated plate shape, and hot-dip solder plating layers 3A, 3B disposed on a front surface and a rear surface of the core material 2. The core material 2 is composed of a lower proof strength metal having a volume resistivity of not greater than about 2.3 μΩ·cm and a proof strength in the range of about 19.6 MPa to about 85 MPa, and more preferably in the range of about 19.6 MPa to about 49 MPa. The hot-dip solder plating layers are inevitably also formed on side surfaces of the core material, but not shown in FIG. 1, or in the figures illustrating other preferred embodiments described later.

Any of various metal materials, such as pure copper and pure silver, having excellent electrical conductivity and solderability may be used for the core material 2, but pure copper is preferred in terms of material costs. The copper material preferably has the highest possible purity, preferably a purity of at least about 99.9 mass %. Among other impurities, oxygen functions to increase the proof strength even if a very small amount of oxygen is present in the copper material. Therefore, the oxygen content is preferably the lowest possible level, and copper materials, such as oxygen free copper (OFHC) and copper refined by vacuum melting method, having an oxygen content of not greater than about 20 ppm are preferred.

Figure 2:
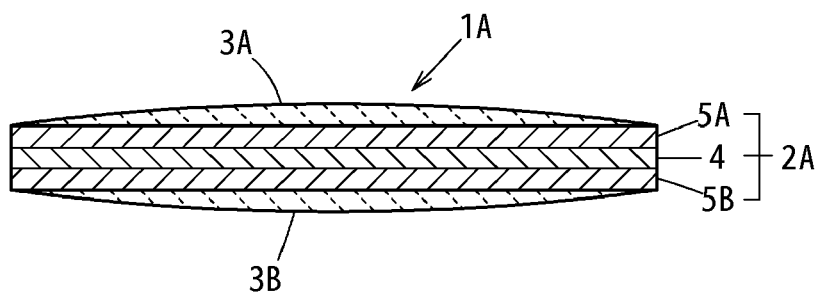
FIG. 2 is a cross sectional view of a clad electrode wire according to a second preferred embodiment of the present invention.

FIG. 2 is a clad electrode wire 1A according to a second preferred embodiment. The electrode wire 1A includes a core material 2A of a clad material having an elongated plate shape, and hot-dip solder plating layers 3A, 3B disposed on a front surface and a rear surface of the core material 2A. The core material 2A includes an interlayer 4 of an aluminum material, and first and second surface layer 5A and 5B of a copper material disposed on opposite surfaces of the interlayer 4. The core material 2A has an average volume resistivity of not greater than about 2.3 μΩ·cm and an average proof strength in the range of about 19.6 MPa to about 85 MPa, and preferably in the range of about 19.6 MPa to about 49 MPa. When only one surface of the electrode wire is to be soldered to electrodes on a semiconductor substrate, it is sufficient to provide the copper layer on only one of the surfaces of the interlayer 4.

The aluminum material is preferably pure aluminum having an Al content of at least about 99.0 mass %, and more preferably at least about 99.9 mass %, or an aluminum alloy having the aforementioned Al content. Examples of the aluminum material include those specified by JIS 1050, 1060, 1085, 1080, 1070, 1N99 and 1N90. On the other hand, the copper material is preferably pure copper having a Cu content of at least about 99.0 mass %, and more preferably at least about 99.9 mass %, or a copper alloy having the aforementioned Cu content. Particularly, pure copper having an oxygen content of not greater than about 20 ppm has a lower proof strength and is preferred.

The interlayer 4 preferably has a thickness which is in the range of about 10% to about 50% of the entire thickness of the core material 2A. A thickness less than about 10% of the thickness of the core material is undesirable because the clad material will have an average proof strength of greater than about 85 MPa. On the other hand, a thickness greater than about 50% of the thickness of the core material is also undesirable because the clad material will have an average volume resistivity of greater than about 2.3 μΩ·cm. The first and second surface layers 5A, 5B preferably have the same thickness. Where the first and second surface layers 5A, 5B have the same thickness, the electrode wire is prevented from being thermally deformed during soldering.

Usable as the core material 2 of the single layer electrode wire 1 is an elongated plate having flattened opposite surfaces formed by rolling a wire having a round section, and an elongated plate prepared by slitting a rolled single layer sheet into a plurality of elongated plates. On the other hand, the core material of the aforementioned clad electrode wire is prepared by slitting a clad sheet having the same cross-sectional configuration into a plurality of elongate plates. The clad sheet is easily prepared by stacking an aluminum sheet and copper sheets for the respective layers, and rolling the resulting stack between a pair of cold or warm press rolls, and annealing the resulting press-bonded material at about 200° C. to about 500° C. for several tens of seconds to several minutes for diffusion.

When the raw materials are worked to form the core material 2, 2A, the core material experiences work hardening, thereby having an increased proof strength. Therefore, it is desirable to soften the core material by sufficiently annealing the core material so as to adjust the proof strength in the range of about 19.6 MPa to about 85 MPa. Since the electrode wire typically has a thickness of about 100 μm to about 300 μm, the annealing is sufficiently performed at about 500° C. for the Cu/Al/Cu clad material or at about 900° C. for the Cu single layer material, respectively, for about one minute.

The softening by annealing may be performed on the core material prepared by slitting the rolled single layer sheet or the clad sheet into elongated plates and cutting the elongated plates to a proper length. Alternatively, the aforementioned sheet may be annealed first (also for diffusion in this case), and then slit and cut to form the core material. Where the proof strength of the elongated plate is set in the range of about 19.6 MPa to about 49 MPa, the former method is more preferred. On the other hand, where the proof strength of the elongated plate is set in the range of about 49 MPa to about 85 MPa, the latter method is preferably used, which is advantageous for mass production.

The elongated plate prepared in the aforementioned manner, i.e., the core material, is thereafter dipped in a plating bath regulated at a hot-dip solder plating temperature, whereby the hot-dip solder plating layers 3A, 3B are formed on the surfaces of the core material. A solder alloy for the hot-dip solder plating layers 3A, 3B will be described below. The hot-dip solder plating temperature is regulated at a temperature in the range of about 50° C. to about 100° C. greater than the melting point of the solder alloy. By adjusting the temperature at the higher level, an annealing effect is provided. Therefore, where the annealing is performed before the slitting, the hot-dip solder plating temperature is preferably set at the higher level.

Figure 3:
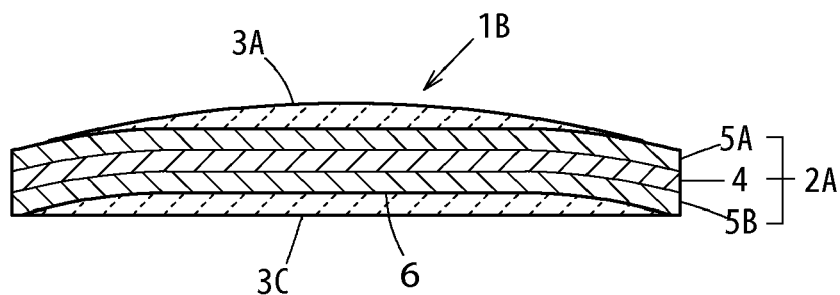
FIG. 3 is a cross sectional view of a clad electrode wire having a hot-dip solder storing recessed portion according to another preferred embodiment of the present invention.

The core material 2, 2A of the single layer electrode wire 1 or the clad electrode wire 1A has a simple substantially rectangular cross-sectional shape as shown in FIG. 1 or 2. However, the clad core material 2A, for example, is preferably configured so as to have a saucer-like cross section, as shown in FIG. 3, having a recessed flat center portion provided on one side (a lower side in this figure) of the cross section. The recessed portion defines a hot-dip solder storing recessed portion 6. The recessed portion preferably has a depth in the range of about 10 μm to about 30 μm at the deepest portion thereof, and a width (an opening width on the lower surface) which is not less than about 90% of the width of the core material 2A. The upper limit of the width is not particularly limited, but the recessed portion may be open across the entire width of the lower surface.

In the case of an electrode wire 1B having the aforementioned hot-dip solder storing recessed portion 6, the molten solder is supplied into the recessed portion 6 to substantially fill the recessed portion 6 when the core material 2A is plated with solder by hot-dip plating. Thus, a hot-dip solder plating layer 3C is formed in the recessed portion 6 so as to have a substantially flat surface. Since the surface of the hot-dip solder plating layer 3C is substantially flat, the solderability is improved.

In order to substantially fill the recessed portion 6 with the supplied molten solder, the molten solder bath temperature and the plating speed for the hot-dip solder plating are properly controlled, or an excess portion of the molten solder bulged from the opening of the recessed portion 6 after the core material 2A is dipped in the molten solder bath is blown off by hot air or scraped away by a scraping member.

The hot-dip solder storing recessed portion 6 is easily formed by working the elongated plate-shaped core material by a suitable method, such as a plastic working method or a bending method. For example, the working of the elongated plate material is easily achieved by passing the elongated plate material between die rolls which are spaced from each other to define a space having a saucer-shaped cross section. Alternatively, when the material sheet is slit into the elongated plates, the lateral edges of the elongated plates may be bent by controlling the distance between rotary cutters of a slitter and/or the rotation speed of the rotary cutters.

Figure 4:
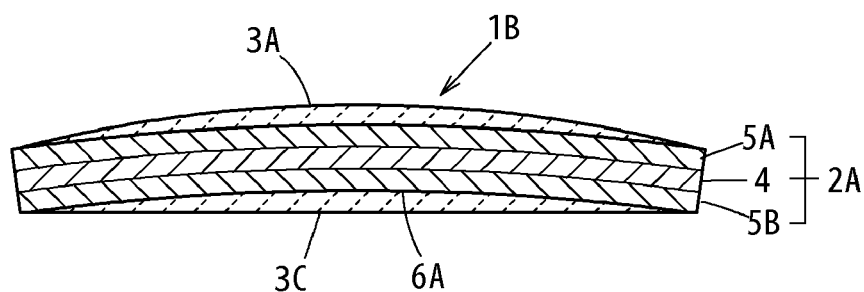
FIG. 4 is a cross sectional view of another clad electrode wire having a hot-dip solder storing recessed portion according to another preferred embodiment of the present invention.

In the preferred embodiment described above, the core material 2A of the electrode wire 1B has a saucer-like cross section such that the recessed portion 6 has a flat center bottom portion, but the sectional shape is not limited to the saucer-like sectional shape. For example, as shown in FIG. 4, the core material 2A may have an entirely curved cross section. In this case, the hot-dip solder storing recessed portion 6A has a curved bottom surface. The simple saucer-like or curved sectional shape of the core material can be easily provided by working, and is advantageous for industrial productivity.

In the preferred embodiment described above, the clad core material 2A is used as the core material having the hot-dip solder storing recessed portion, but the rolled single layer core material may be used. As in the case of the single layer electrode wire, the annealing of the rolled single layer core material or the clad core material for softening may be performed after the elongated plate is prepared by the slitting and cutting of the rolled single layer sheet or the clad sheet and formed with the recessed portion.

Alternatively, the sheet may be annealed first, followed by the slitting and cutting of the sheet and the formation of the recessed portion. Where the latter method is used, the hot-dip solder plating temperature is preferably set at a higher level to provide the annealing effect in the hot-dip solder plating.

Examples of the solder material for the hot-dip solder plating layers 3A, 3B, 3C include Sn—Pb alloys, Sn-(0.5 to 5 mass %)Ag alloys, Sn-(0.5 to 5 mass %)Ag-(0.3 to 1.0 mass %)Cu alloys, Sn-(0.3 to 1.0 mass %)Cu alloys, Sn-(1.0 to 5.0 mass %)Ag-(5 to 8 mass %)In alloys, Sn-(1.0 to 5.0 mass %)Ag-(40 to 50 mass %)Bi alloys, Sn-(40 to 50 mass %)Bi alloys and Sn-(1.0 to 5.0 mass %)Ag-(40 to 50 mass %)Bi-(5 to 8 mass %)In alloys, which each have a melting point of about 130° C. to about 300° C. Since Pb is likely to pose a health hazard and pollute the natural environment, lead-free solder materials such as the Sn—Ag alloys, the Sn—Ag—Cu alloys, the Sn—Cu alloys, the Sn—Ag—In alloys and the Sn—Ag—Bi alloys are preferred from the viewpoint of preventing pollution. For prevention of oxidation of the molten solder, one or more of about 50 ppm to about 200 ppm of P, several ppm to several tens of ppm of Ga, several ppm to several tens of ppm of Gd and several ppm to several tens of ppm of Ge may be added to any of the aforementioned solder materials. The hot-dip solder plating layer may have a multi-layer structure formed by using various pure metals such as Sn, Ag and Cu and/or alloys of any of these metals. In this case, the thicknesses of the respective layers are adjusted so that a solder resulting from the melting of the hot-dip solder plating layer has an intended alloy composition. The multi-layer structure is easily formed by sequentially performing predetermined plating processes.

Next, a solar cell including any of the electrode wires of the aforementioned preferred embodiments as a connection lead wire will be described with reference to the drawing.

Figure 5:
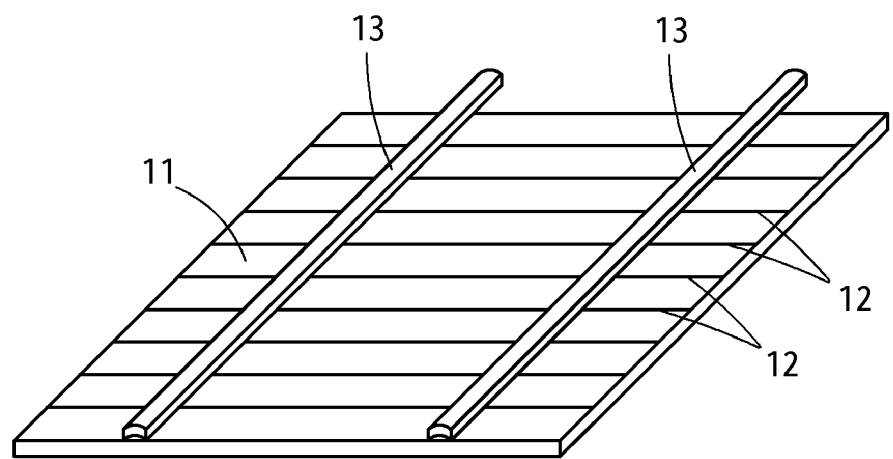
FIG. 5 is a schematic perspective view of a solar cell employing inventive electrode wires.

FIG. 5 illustrates a solar cell including connection lead wires 13 each prepared by using the electrode wire having the hot-dip solder storing recessed portion. The solar cell includes a semiconductor substrate 11 of a silicon semiconductor having PN junctions, and connection lead wires 13 each soldered to a plurality of linear front surface electrodes 12 disposed on a front surface of the semiconductor substrate 11. Rear surface electrodes each having a larger area of about 40 mm² to about 80 mm² are disposed on a rear surface of the semiconductor substrate 11.

Before the soldering of the connection lead wires 13, solder bands are formed on the semiconductor substrate 11 so as to extend perpendicularly to the linear front surface electrodes 12 so as to be electrically connected to the linear front surface electrodes 12. The connection lead wires 13 are disposed on the semiconductor substrate 11 so that the hot-dip solder plating layers disposed in the hot-dip solder storing recessed portions of the connection lead wires are respectively brought into contact with the solder bands. Then, the solder bands on the semiconductor substrate 11 and the hot-dip solder plating layers of the connection lead wires 13 are melted together, whereby the connection lead wires 13 are soldered to the front surface of the semiconductor substrate 11. Thus, the connection lead wires 13 of the electrode wires are bonded to the semiconductor substrate 11. Since the rear surface electrodes each have a relatively large exposure area (of about 40 mm² to about 80 mm²), the connection lead wires are easily soldered to rear surface electrodes of an adjacent solar cell as compared to the soldering to the front surface electrodes.

In the solar cell, the electrode wires are plastically deformed by thermal stress during the soldering, so that thermal stress occurring in the semiconductor substrate is alleviated. Therefore, cracking is unlikely to occur in the semiconductor substrate. In addition, the electrode wires have a lower volume resistivity and, thus, have excellent electrical conductivity. Therefore, the power generation efficiency is improved. Furthermore, each of the electrode wires include the hot-dip solder storing recessed portion, and the hot-dip solder plating layer having a flat surface is located in the recessed portion. Therefore, the electrode wires have excellent solderability, so that the connection lead wires 13 are securely bonded to the semiconductor substrate 11. Accordingly, the connection lead wires are less likely to be disconnected from the semiconductor substrate, and thus, have excellent durability.

The inventive electrode wire will hereinafter be described more specifically by way of examples thereof. However, it should be understood that the present invention is not limited to these examples.

EXAMPLE A

Various clad materials were prepared by press-bonding surface layers of oxygen-free copper (Cu: 99.97 mass %, O: 15 ppm) to opposite surfaces of an interlayer of aluminum (specified by JIS 1N90, Al: 99.90 mass %) or Invar (Fe-36.5 mass % Ni) and annealing the resulting stack for diffusion. The clad materials (core materials) each had a thickness of about 160 μm, and the ratio of the thickness of the interlayer to the thickness of the clad material is shown in Table 1. Each of the clad materials were slit to form elongated plates each having a width of about 2 mm, and each of the elongated plates were cut to a length of about 150 mm, whereby a plurality of core materials were prepared. The core materials were annealed at about 500° C. for about one minute for softening. Furthermore, a plurality of core materials were prepared in substantially the same manner as described above by using a rolled sheet of the oxygen-free copper, and some of the core materials were annealed for softening. In addition, core materials were prepared by cutting a flattened copper wire (having a thickness of about 160 μm and a width of about 2 mm) of tough pitch copper (Cu: 99.94 mass %, O: 33 ppm) to the same length as the above-mentioned without the annealing.

A tensile test was performed by a method specified by JIS Z2241, in which the core materials were each stretched longitudinally to measure the proof strength thereof. Furthermore, the volume resistivity of each of the core materials was measured by a method specified by JIS H0505. The results of the measurement are also shown in Table 1.

After the surfaces of the core materials were cleaned with acetone, the core materials were quickly dipped in a molten solder plating bath (solder composition: Sn-3.5 mass % Ag, melting point: 220° C., bath temperature: 300° C.), whereby hot-dip solder plating layers were formed on surfaces of the core materials. The hot-dip solder plating layers of the electrode wires thus prepared each had an average thickness of about 40 μm.

The electrode wires thus prepared were each held in contact with a solder band of a solar cell silicon substrate (having a thickness of 200 μm) at about 260° C. for one minute, thereby soldered to the substrate. The solder band was previously formed on a front surface of the silicon substrate so as to extend across a plurality of front surface electrodes disposed on the substrate. After the soldering, the silicon substrate was checked for cracks. The results of the check are also shown in Table 1.

As shown in Table 1, the electrode wires (Sample Nos. 1, 2 and 4) of the examples, whether they are of the single layer type or of the clad type, each had a proof strength of not greater than about 49 MPa. Therefore, the thin silicon substrates each having a thickness of about 200 μm were free of cracks. In the case of the electrode wire of Sample No. 7 prepared by working the oxygen-free copper and not annealed for softening, the proof strength was about 147 MPa, so that the silicon substrate was cracked. In the case of the electrode wires of the examples, it was confirmed that the volume resistivity was lower as compared to the prior art clad electrode wire (Sample No. 5) having the Invar interlayer and the electrical conductivity was excellent.

TABLE 1

| Sample No. | Core material Structure & materials | Interlayer Thickness ratio | Annealing for softening Done: ○ Not done: X | Proof strength MPa | Volume resistivity μΩ·cm | Cracking of silicon substrate Absent: ○ Present: X |
|---|---|---|---|---|---|---|
| *1 | Cu/Al/Cu | 20% | ○ | 38.2 | 2.0 | ○ |
| *2 | Cu/Al/Cu | 33% | ○ | 36.3 | 2.2 | ○ |
| 3 | Cu/Al/Cu | 60% | ○ | 34.3 | 2.6 | X |
| *4 | Cu single layer | — | ○ | 41.2 | 1.8 | ○ |
| 5 | Cu/Invar/Cu | 33% | ○ | 98 | 2.3 | ○ |
| 6 | Flattened copper wire | — | X | 98 | 1.8 | X |
| 7 | Cu single layer | — | X | 147 | 1.8 | X |

(Note)
Cu: Oxygen-free copper,
Material for flattened copper wire: Tough pitch copper
Sample Nos. prefixed with *Examples, Sample Nos. 3, 7: Comparative examples Sample Nos. 5, 6: Prior art examples

EXAMPLE B

Various clad materials were each prepared by press-bonding surface layers of oxygen-free copper (Cu: 99.97 mass %, O: 15 ppm) to opposite surfaces of an interlayer of aluminum (specified by JIS 1N90, Al: 99.90 mass %) or Invar (Fe-36.5 mass % Ni) and annealing the resulting stack for diffusion. The clad materials (core materials) each had a thickness of about 200 μm, and the ratio of the thickness of the interlayer to the thickness of the clad material is shown in Table 2. The clad materials were annealed at about 500° C. for one minute for softening. Then, each of the clad materials were slit to form elongated plates each having a width of about 2 mm, and each of the elongated plates were cut to a length of about 150 mm, whereby a plurality of core materials were prepared. Furthermore, a plurality of core materials were prepared by annealing a rolled sheet of the oxygen-free copper for softening in the same manner as described above and then slitting the annealed sheet.

After the surfaces of the core materials were cleaned with acetone, some of the core materials in each core material group were quickly dipped in a molten solder plating bath (solder composition: Sn-3.5 mass % Ag, melting point: 220° C., bath temperature: 300° C.), whereby hot-dip solder plating layers were formed on surfaces of the core materials. The hot-dip solder plating layers of the electrode wires thus prepared each had an average thickness of about 40 μm.

The other core materials in each core material group were quickly dipped in a salt bath (bath temperature: 300° C.) containing potassium nitrate and sodium nitrite as major components under the same conditions as in the dipping in the molten solder plating bath. Thus, the other core materials were subjected to a heat treatment under the same conditions as in the dipping of the core materials for the formation of the hot-dip solder plating layers. The core materials dipped in the salt bath were rinsed with water to remove the salts from the surfaces thereof, and then the proof strength and the volume resistivity were measured in the same manner as in Example A. The results of the measurement are also shown in Table 2.

As in Example A, each of the electrode wires were soldered to a solar cell silicon substrate (having a thickness of about 200 μm). After the soldering, the silicon substrate was checked for cracks. The results of the check are also shown in Table 2.

As shown in Table 2, the electrode wires (Sample Nos. 11, 12 and 14) of the examples, whether they are of the single layer type or of the clad type, each had a proof strength of not greater than about 85 MPa. Therefore, the thin silicon substrates each having a thickness of about 200 μm were free of cracks. Furthermore, it was confirmed that the volume resistivity was about 2.2 μΩ·cm or less and the electrical conductivity was excellent.

TABLE 2

| Sample No. | Core material Structure & materials | Interlayer Thickness ratio | Annealing for softening Done: ○ Not done: X | Proof strength MPa | Volume resistivity μΩ·cm | Cracking of silicon substrate Absent: ○ Present: X |
|---|---|---|---|---|---|---|
| *11 | Cu/Al/Cu | 20% | ○ | 85 | 2.0 | ○ |
| *12 | Cu/Al/Cu | 30% | ○ | 72 | 2.2 | ○ |
| 13 | Cu/Al/Cu | 60% | ○ | 55 | 2.6 | X |
| *14 | Cu single layer | — | ○ | 85 | 1.8 | ○ |

(Note)
Cu: Oxygen-free copper
Sample Nos. prefixed with *Examples, Sample Nos. 13: Comparative examples While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A solar cell electrode wire before being soldered to a solar cell, comprising:

a core material composed of pure Cu having a Cu content of not less than 99.9 mass %, having a volume resistivity of not greater than about 2.3 µΩ·cm, and having a proof stress in a range of about 36.3 MPa to about 85 MPa; and a hot-dip solder plating layer having a melting point of about 130° C. to about 300° C. and disposed on a surface of the core material.

2. A solar cell electrode wire according to claim 1, wherein the core material is composed of an annealed pure copper material having an oxygen content of not greater than about 20 ppm.

3. A solar cell electrode wire according to claim 1, wherein the core material has a recessed portion arranged along a longitudinal direction of the core material for storing molten solder and the hot-dip solder plating layer is located in the recessed portion.

4. A solar cell electrode wire according to claim 3, wherein an opening width of the recessed portion as measured transversely of the core material is not less than about 90% of a width of the core material.

5. A solar cell electrode wire according to claim 1, wherein the proof stress of the core material is in a range of about 36.3 MPa to about 49 MPa.

6. A solar cell electrode wire before being soldered to a solar cell comprising:

a core material made of a clad material including an interlayer and first and second surface layers disposed on opposite surfaces of the interlayer; and a hot-dip solder plating layer having a melting point of about 130° C. to about 300° C. and disposed on a surface of the core material; wherein the first surface layer and the second surface layer are composed of pure Cu having a Cu content of not less than 99.9 mass %;

the interlayer is composed of pure Al having an Al content of not less than 99.0 mass %; and the core material has an average volume resistivity of not greater than about 2.3 µΩ·cm and has an average proof stress in a range of about 36.3 MPa to about 85 MPa.

7. A solar cell electrode wire according to claim 6, wherein the first surface layer and the second surface layer are composed of the same material and have the same thickness.

8. A solar cell electrode wire according to claim 6, wherein the first surface layer and the second surface layer are composed of an annealed pure copper material having an oxygen content of not greater than about 20 ppm.

9. A solar cell electrode wire according to claim 8, wherein the interlayer has a thickness in a range of about 10% to about 50% of an entire thickness of the clad material.

10. A solar cell electrode wire according to claim 6, wherein the core material has a recessed portion arranged along a longitudinal direction of the core material for storing molten solder and the hot-dip solder plating layer is located in the recessed portion.

11. A solar cell electrode wire according to claim 10, wherein an opening width of the recessed portion as measured transversely of the core material is not less than about 90% of a width of the core material.

12. A solar cell electrode wire according to claim 6, wherein the average proof stress of the core material is in a range of about 36.3 MPa to about 49 MPa.

* * * * *